(12) United States Patent
Chen et al.

(10) Patent No.: US 10,242,720 B2
(45) Date of Patent: Mar. 26, 2019

(54) DUAL SENSING CURRENT LATCHED SENSE AMPLIFIER

(75) Inventors: Nan Chen, San Diego, CA (US); Ritu Chaba, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 802 days.

(21) Appl. No.: 12/731,623

(22) Filed: Mar. 25, 2010

(65) Prior Publication Data

US 2011/0235449 A1    Sep. 29, 2011

(51) Int. Cl.
*G11C 7/00* (2006.01)
*G11C 7/06* (2006.01)
*G11C 7/08* (2006.01)
*G11C 7/12* (2006.01)

(52) U.S. Cl.
CPC ............... *G11C 7/065* (2013.01); *G11C 7/00* (2013.01); *G11C 7/08* (2013.01); *G11C 7/12* (2013.01)

(58) Field of Classification Search
CPC .............. G11C 7/065; G11C 2207/005; G11C 2207/063
USPC .......... 365/189.05, 190, 205, 207, 208, 214; 327/52, 54–55, 57
See application file for complete search history.

(56) References Cited

U.S. PATENT DOCUMENTS

| | | | | |
|---|---|---|---|---|
| 4,255,678 A | * | 3/1981 | Suzuki et al. | 327/57 |
| 4,804,871 A | * | 2/1989 | Walters, Jr. | 327/54 |
| 5,228,106 A | * | 7/1993 | Ang et al. | 365/208 |
| 5,457,657 A | * | 10/1995 | Suh | 365/205 |
| 5,859,548 A | * | 1/1999 | Kong | 326/113 |
| 6,225,834 B1 | | 5/2001 | Gang | |
| 6,687,175 B1 | * | 2/2004 | Mizuno et al. | 365/203 |
| 7,263,016 B1 | | 8/2007 | Palumbo et al. | |
| 7,298,180 B2 | * | 11/2007 | Hung | 327/57 |
| 7,372,746 B2 | * | 5/2008 | Kim | 365/189.06 |
| 7,586,803 B2 | * | 9/2009 | Do | 365/205 |
| 8,570,823 B2 | * | 10/2013 | Chen et al. | 365/205 |

(Continued)

FOREIGN PATENT DOCUMENTS

| | | |
|---|---|---|
| CN | 101840723 A | 9/2010 |
| EP | 0301277 A2 | 2/1989 |

(Continued)

OTHER PUBLICATIONS

International Search Report and Written Opinion—PCT/US2011/029479—ISA/EPO—dated May 10, 2011.
Taiwan Search Report—TW100110472—TIPO—dated Jul. 23, 2014.

*Primary Examiner* — Harry W Byrne
*Assistant Examiner* — R Lance Reidlinger
(74) *Attorney, Agent, or Firm* — W & T/Qualcomm

(57) ABSTRACT

A sense amplifier and method thereof are provided. The sense amplifier includes first and second transistors coupled to first and second bit lines, respectively. The first and second transistors are configured to connect the first and second bit lines to a differential amplifier during a first state (e.g., when a differential voltage is present on the first and second bit lines and prior to a sense signal transition) and to isolate the first and second bit lines from the differential amplifier during a second state (e.g., after the sense signal transition). The sense amplifier further includes a third transistor configured to deactivate the differential amplifier during the first state and configured to activate the differential amplifier during the second state.

34 Claims, 4 Drawing Sheets

Fig. 3

(56) References Cited

U.S. PATENT DOCUMENTS

2004/0136253 A1    7/2004   Gupta et al.
2004/0174759 A1    9/2004   Bhat et al.

FOREIGN PATENT DOCUMENTS

| | | |
|---|---|---|
| JP | 64062896 | 3/1989 |
| JP | H07153270 A | 6/1995 |
| JP | H08147976 A | 6/1996 |
| JP | 2001076491 A | 3/2001 |
| JP | 2001216785 A | 8/2001 |
| TW | 200832428 A | 8/2008 |

\* cited by examiner

DUAL SENSING CURRENT LATCHED SENSE AMPLIFIER

FIELD OF DISCLOSURE

Disclosed embodiments are related to sense amplifiers circuits and methods. In particular the embodiments relate to dual sensing current latched sense amplifiers.

BACKGROUND

Memory devices conventionally include arrays of bit cells that each store a bit of data. Each data bit can represent a logical low ("0") or a logical high ("1"), which may correspond to a state of the bit cell. For example, during a read operation a voltage level at a selected bit cell close to ground may be representative a logical low or "0" and a higher voltage level may be representative of a logical high or "1." Bit lines are coupled to various bit cells in the memory array and couple the bit cells to other components used in read/write operations.

For example, during a read operation, the voltage/current representing a state of a selected bit cell may be detected via the bit lines coupled to the selected bit cell. A sense amplifier may be coupled to the bit lines to amplify the differential voltage/current to aid in determining the logical state of the bit cell.

As discussed above, a sense amplifier (SA) is a basic component that is used for operations in memory devices. A commonly used sense amplifier is a current latched sense amplifier (CLSA).

FIG. 1 illustrates a conventional CLSA 100. Referring to FIG. 1, the CLSA 100 includes NMOS transistors N1 through N5, PMOS transistors P1 through P4 and capacitors C1 and C2. The CLSA 100 receives differential input bit line BIT and inverted bit line BITB, sense signal SENSE and is coupled to a power supply voltage Vdd.

Referring to FIG. 1, the differential inputs BIT, BITB are applied to gates of NMOS transistors N1 and N2, respectively. The sense signal SENSE is applied to NMOS transistor N5 and PMOS transistors P1 and P4. When the sense signal SENSE is low, transistors P1 and P4 are conducting or "on" and allow capacitors C1 and C2 to charge. When the sense signal SENSE transitions to a higher logic level (e.g., "1"), the current through the gates N1 and N2 will be different if the voltages on differential inputs BIT and BITB are different. A different current flow through N1/N3 and N2/N4 will cause a voltage difference between output nodes sout and soutb as the capacitors will be discharged at a different rate. If a voltage on one of the output nodes (sout or soutb) reaches a threshold value to turn on one of cross coupled transistors P2 or P3, and turn off one of corresponding transistors N3 or N4, then a corresponding one of nodes sout or soutb will be coupled to Vdd. The other pair of transistors P1/N3 or P2/N4 cross coupled to the output node (sout or soutb) and coupled to Vdd will remain in a state with the PMOS transistor off and the NMOS transistor conducting. Accordingly, one of the output nodes sout or soutb will be latched to a high state and the other output node will be discharged, so the voltage differential between sout and soutb will be further amplified.

FIG. 2 illustrates another conventional CLSA 200. Referring to FIG. 2, the CLSA 200 includes NMOS transistors N1 through N5, PMOS transistors P1 through P6 and capacitors C1 and C2. The CLSA 200 receives differential inputs BIT and BITB, sense signal SENSE and is coupled to power supply voltage Vdd. The operation of the CLSA 200 is similar to that of the CLSA 100. However, the CLSA 200 differs from CLSA 100 in that the differential inputs BIT and BITB are coupled to nodes sa and sab through PMOS transistors P5 and P6 (which are not present in CLSA 100) prior to a triggering of a sensing operation (when sense signal SENSE is low), which can increase a sensitivity of the CLSA 200 as compared to CLSA 100.

Thus, CLSA 100 and CLSA 200 are configured to sense voltage differentials in different manners. Also, CLSA 200 is able to achieve greater sensitivity than the CLSA 100 but only at the cost of including additional PMOS transistors, which can increase the layout area, power consumption and leakage of the sense amplifier.

SUMMARY

Exemplary embodiments are directed to current latched sense amplifiers, related circuits and methods.

Accordingly, an embodiment can include a current latched sense amplifier comprising: first and second transistors coupled to first and second bit lines, respectively, the first and second transistors configured to couple the first and second bit lines to first and second output nodes of the sense amplifier in a first phase and to isolate the first and second output nodes in a second phase; and third and fourth transistors having gates coupled to the first and second bit lines and coupled to current paths of the first second and first output nodes, respectively, and configured to be activated during the second phase.

Another embodiment is directed to a method of sensing a differential between two bit lines, comprising: coupling a first bit line to a first output node of a sense amplifier and a second bit line to a second output node of the sense amplifier, in a first phase to supply an initial differential voltage to the sense amplifier; decoupling the first bit line from the first output node and the second bit line from the second output node during a second phase; and amplifying the initial differential voltage by discharging the first output node based on a voltage on the second bit line and the second output node based on a voltage on the first bit line, in the second phase.

Another embodiment is directed to an apparatus for sensing a differential between two bit lines, comprising: means for coupling a first bit line to a first output node of a sense amplifier and a second bit line to a second output node of the sense amplifier, in a first phase to supply an initial differential voltage to the sense amplifier; means for decoupling the first bit line from the first output node and the second bit line from the second output node during a second phase; and means for amplifying the initial differential voltage by discharging the first output node based on a voltage on the second bit line and the second output node based on a voltage on the first bit line, in the second phase.

Another embodiment is directed a method of sensing a differential between two bit lines, comprising: step for coupling a first bit line to a first output node of a sense amplifier and a second bit line to a second output node of the sense amplifier, in a first phase to supply an initial differential voltage to the sense amplifier; step for decoupling the first bit line from the first output node and the second bit line from the second output node during a second phase; and step for amplifying the initial differential voltage by discharging the first output node based on a voltage on the second bit line and the second output node based on a voltage on the first bit line, in the second phase.

BRIEF DESCRIPTION OF THE DRAWINGS

A more complete appreciation of embodiments and many of the attendant advantages thereof will be readily obtained as the same becomes better understood by reference to the following detailed description when considered in connection with the accompanying drawings which are presented solely for illustration and not limitation of the embodiments.

DETAILED DESCRIPTION

Aspects are disclosed in the following description and related drawings directed to specific embodiments. Alternate embodiments may be devised without departing from the scope of the invention. Additionally, well-known elements will not be described in detail or will be omitted so as not to obscure the relevant details of the disclosed embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the embodiments may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 3:
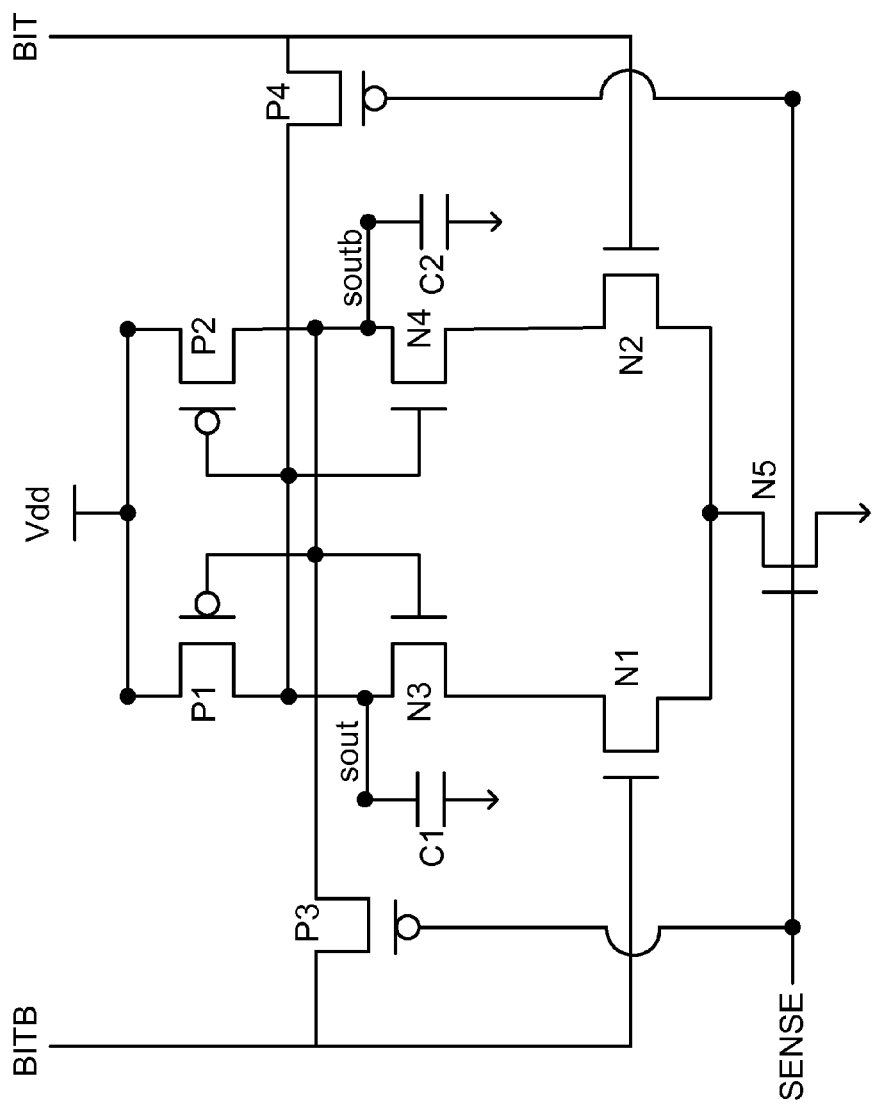
FIG. 3 illustrates a current latched sense amplifier (CLSA) according to at least one embodiment.

FIG. 3 illustrates a dual sensing current latch sense amplifier (DSCLSA) 300 according to at least one embodiment. Referring to FIG. 3, the DSCLSA 300 includes NMOS transistors N1 through N5, PMOS transistors P1 through P4 and capacitors C1 and C2. The DSCLSA 300 receives differential bit line inputs BIT and BITB, sense signal SENSE and is coupled to supply voltage Vdd. As previously discussed, the bit lines may be couple to a plurality of bit cells in a memory array. A memory read operation can be coordinated with the DSCLSA 300 such that the sense signal SENSE can be triggered at an appropriate time after a bit cell has been selected to be read. The various control circuits for memory addressing, read and write operations are well known and will not be described herein.

As illustrated in FIG. 3, any differential voltage between BIT/BITB is provided at sout and soutb at a drain terminal of cross coupled inverted amplifiers P1/N3 and P2/N4 (which can be considered a differential amplifier) and to gates of PMOS transistors P1 and P2, respectively before the DSCLSA 300 is triggered. The differential voltage at sout and soutb is also provided at gates of NMOS transistors N3 and N4.

Referring to FIG. 3, the voltage differential of bit line BIT, BITB are also applied to the gates of NMOS transistors N1 and N2, respectively, and are also applied to source inputs of PMOS transistors P3 and P4, respectively. The sense signal SENSE is applied to the gates of NMOS transistor N5 and PMOS transistors P3 and P4. As will now be described in greater detail, the DSCLSA 300 is "dual sensing" because the DSCLSA 300 is capable of amplifying a voltage differential at sout and soutb in two different manners, which reinforce each other and increase a sensitivity of the DSCLSA 300.

It will be appreciated that in a first phase prior to triggering the DSCLSA 300, when the sense signal SENSE is at a low logic level or logic "0", a differential voltage may already be developed, at least partially, between the nodes sout and soutb. This is because PMOS transistors P3 and P4 are gated on when sense signal SENSE is set to the lower logic level, thereby coupling BIT to node sout and BITB to node soutb.

In a second phase when the DSCLSA 300 is triggered, the sense signal SENSE transitions from the lower logic level to a higher logic level or "1". PMOS transistors P3 and P4 transition to an "off" state, whereas NMOS transistor N5 transitions to an "on" state. As noted above, the differential bit line inputs BIT, BITB are coupled to the gates of NMOS transistors N1 and N2. Accordingly, when transistor N5 turns on, the differential voltage applied to the gates of NMOS transistors N1 and N2 causes different currents at N1 and N2, respectively. The different currents at NMOS transistors N1 and N2 increases the voltage differential at nodes sout and soutb by discharging capacitors C1 and C2 through transistors N3 and N4, respectively.

Figure 1:
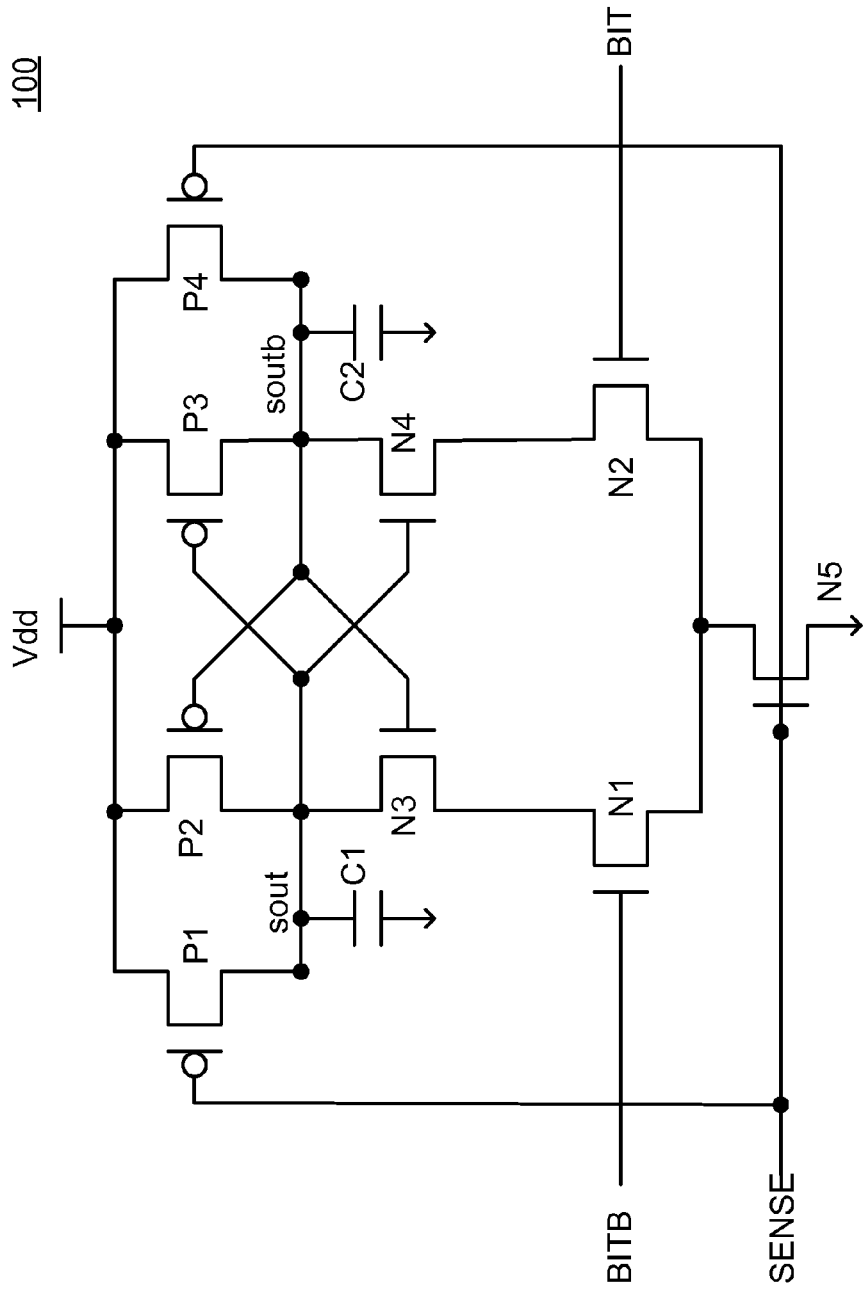
FIG. 1 illustrates a conventional current latched sense amplifier (CLSA).
Figure 2:
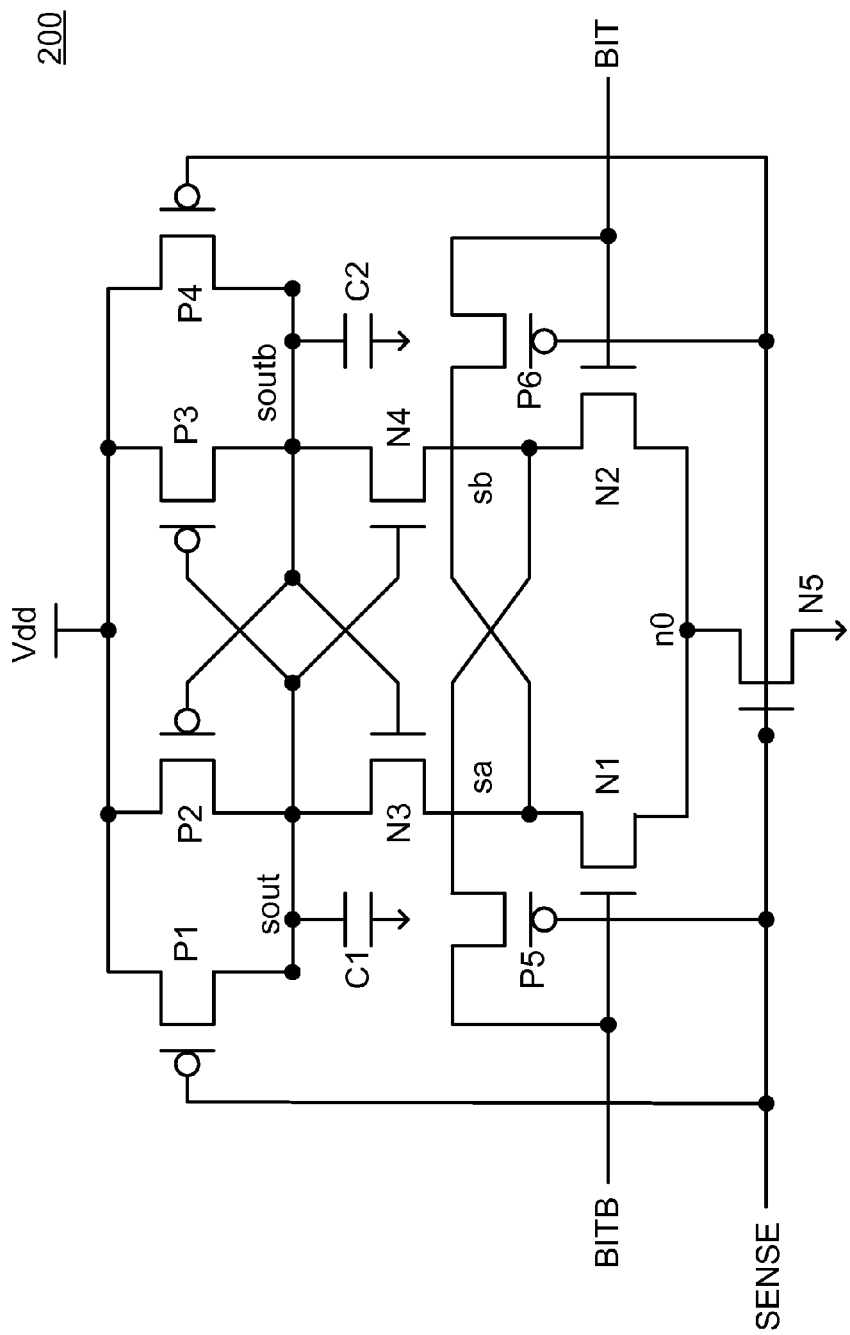
FIG. 2 illustrates another conventional current latched sense amplifier (CLSA).

Accordingly, the voltage differential at sout and soutb that is amplified by the DSCLSA 300 is based on an initial differential voltage occurring prior to a transition of the sense signal SENSE from a lower logic level to a higher logic level which enhances the differential voltage determined when the sense signal SENSE transitions to the higher logic level. Also, the enhanced sensitivity of the DSCLSA 300 is provided without an increase in the number of components and without an increase in the area used in the layout of the DSCLSA 300, over the conventional CLSA 100. Additionally, fifth and sixth PMOS transistors P5 and P6, which are present within the CLSA 200 of FIG. 2, need not be included within DSCLSA 300. Accordingly, DSCLSA 300 may occupy less physical space, use less power, and have less leakage compared to CLSA 200 of FIG. 2.

For example, referring to FIG. 3, assume that sense signal SENSE is set to the lower logic level, and a bit line voltage at BITB is equal to a bit line voltage at BIT. Next, assume during a memory operation the bit line voltage at BITB drops a given amount (e.g., 20 mV). The BIT and BITB bit line voltages pass through PMOS transistors P4 and P3, respectively, until sense signal SENSE transitions to the higher logic level. Thus, sout and soutb are set to different voltages before sense signal SENSE transitions to the higher logic level. For example, this could be during a read operation prior to the DSCLSA 300 being triggered by sense signal SENSE and the output (sout, soutb) being read. Further, it will be appreciated that C1 and C2 do not have a discharge path through N1/N3 and N4/N2, respectively, as transistor N5 will be non-conducting or "off" prior to the transition of sense signal SENSE to the higher logic level.

When signal SENSE transitions to the higher logic level to trigger the DSCLSA 300, transistors P3 and P4 turn off, and transistor N5 turns on, thereby providing a current path through transistor N5 and discharge paths through transistors N1/N3 and N2/N4 for capacitors C1 and C2, respectively. Additionally, the voltage differential which has already developed between sout and soutb is provided to the gates of N1 and N2. This differential voltage at the gates of N1 and N2 causes different currents to flow through N1 and N2, which reinforces the initial voltage difference at sout and soutb because the current through the gates N1 and N2 will be different if the voltages on differential inputs BIT and BITB are different. The different current flows through N1/N3 and N2/N4 will cause the voltage difference between output nodes sout and soutb to increase as the capacitors C1 and C2 will be discharged at different rates.

For example in a first phase, assume that the difference between BIT and BITB is 20 mV prior to the DSCLSA 300 being triggered, as discussed above. This initial voltage differential will be provided to sout and soutb because transistors P3 and P4 are both on. Specifically, the voltage on BIT will be coupled to node sout via transistor P4 and the voltage on BITB will be coupled to soutb via transistor P3. In the second phase, when the DSCLSA 300 is triggered (i.e., SENSE transitions to a high level), transistor N5 is turned on and the current can flow through N1 and N2. The current flowing through N2 will be greater than that of N1, because of the higher voltage on BIT. This in turn will enhance the differential already established between soutb and sout, because the charge on C2 coupled to node soutb will be discharged at a higher rate than C1 coupled to node sout.

Accordingly, the voltage differential at sout and soutb can be developed in response to a bit line voltage differential by two separate phases (i.e., both before and after SENSE transitions to a high level). This is accomplished without including additional transistors (e.g., as in FIG. 2) which can increase the layout area of the sense amplifier.

Figure 4:
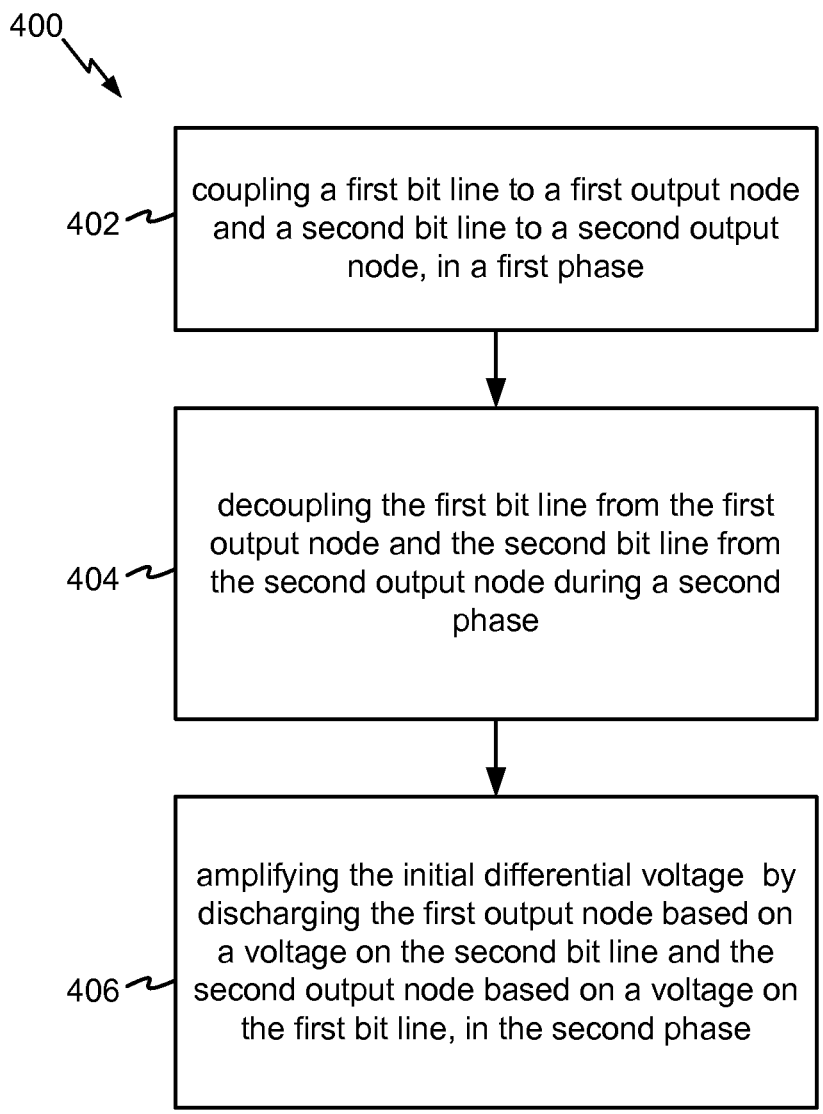
FIG. 4 illustrates a flowchart for an exemplary method.

It will be appreciated that embodiments can include various methods for performing the processes, functions and/or algorithms disclosed herein. For example, as illustrated in FIG. 4, an embodiment can include a method of sensing a voltage differential at a sense amplifier. For example, the method can include coupling a first bit line (e.g., BIT) to a first output node (e.g., sout) and a second bit line (e.g., BITB) to a second output node (soutb), in a first phase to supply an initial differential voltage to the sense amplifier, block 402. During a second phase, the first bit line is decoupled from the first output node and the second bit line is decoupled from the second output node, block 404. Then, initial differential voltage (between sout and soutb) can be amplified by discharging the first output node (sout) based on a voltage on the second bit line (BITB) and the second output node (soutb) based on a voltage on the first bit line, in a second phase, block 406. As discussed above, in the second phase transistors P3 and P4 decouple the bit lines from the output nodes/gars of the cross coupled inverters (P1/N3 and P2/N4), which leaves any differential voltage at the common output/gates. Also, during the second phase transistor N5 is activated, which activates the sense amplifier in that current can flow through the inverters or at least though N3/N4 to discharge the output nodes if P1 or P2 is gated off Essentially, the voltage differential will be amplified, because the lower voltage (of the initial differential voltage) will be applied to the gate of the transistor (N1/N2) coupled in series with the higher voltage node (sout/soutb) and higher voltage will be applied to the gate of the transistor (N1/N2) coupled in series with the lower voltage node (sout/soutb). Accordingly, the reverse differential is applied to gates of the transistors in the current path of the output nodes.

It will be appreciated that the method illustrated in the flowchart of FIG. 4 is merely one embodiment and is not intended to limit the various embodiments to the illustrated examples. For example, other functional aspects/sequence of actions discussed herein may be added to the actions discussed in relation to FIG. 4 including alternatives to the actions already described.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, it will be appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the invention.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM, a solid state memory device, such as a flash-drive, or other optical disk storage, magnetic disk storage or other magnetic storage devices, or any other medium that can be used to carry or store desired program code in the form of instructions or data structures and that can be accessed by a computer. Also, any connection is properly termed a computer-readable medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

It will be appreciated that sense amplifiers, as illustrated for example in FIG. 3, may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments may include any device which includes sense amplifiers as disclosed herein.

Further, it will be appreciated that various to memory devices can include an multiple sense amplifiers as disclosed herein. Accordingly, although potions of the foregoing disclosure discuss the sense amplifier in isolation, it will be appreciated that various embodiments can include devices into which the sense amplifier is integrated, such as memory devices comprising arrays of memory cells and a plurality of sense amplifiers.

The foregoing disclosed devices and methods may be designed and configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Accordingly, embodiments can include machine-readable media or computer-readable media embodying instructions which when executed by a processor transform the processor and any other cooperating elements into a machine for performing the functionalities described herein as provided for by the instructions. Accordingly, the scope of the invention is not limited to illustrated examples and any means for performing the functionality described herein are included in embodiments.

In conjunction with the described embodiments, an apparatus is disclosed that includes means for supplying a first initial voltage to a first node of a sense amplifier based on a first voltage of a first bit line and for isolating the first bit line from the first node. For example, the means for supplying the first initial voltage to the first node and for isolating the first bit line from the first node may include the PMOS transistor (P4), the bit line (BIT), the sense signal (SENSE), or one or more other circuit components of FIG. 3, to charge the first node and isolate the first bit line from the first node, or any combination thereof.

The apparatus may also include means for supplying a second initial voltage to a second node of the sense amplifier based on a second voltage of a second bit line and for isolating the second bit line from the second node. For example, the means for supplying the second initial voltage to a second node and for isolating the second bit line from the second node may include the PMOS transistor (P3), the bit line (BITB), the sense signal (SENSE), or one or more other circuit components of FIG. 3, to charge the second node and isolate the second bit line from the first node, or any combination thereof.

The apparatus may also include means for discharging the first node. For example, the means for discharging the first node may include the NMOS transistor (N1), the NMOS transistor (N3), the NMOS transistor (N5), the PMOS transistor (P1), the sense signal (SENSE), or one or more other circuit components of FIG. 3, to discharge the first node, or any combination thereof.

The apparatus may also include means for discharging the second node. For example, the means for discharging the second node may include the NMOS transistor (N2), the NMOS transistor (N4), the NMOS transistor (N5), the PMOS transistor (P2), the sense signal (SENSE), or one or more other circuit components of FIG. 3, to discharge the second node, or any combination thereof.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of embodiments may be described or claimed in the singular, the plural is contemplated unless limitation to the singular is explicitly stated.

What is claimed is:

1. An apparatus comprising:
    a current latched sense amplifier comprising:
        a first transistor having a first source coupled to a first bit line and a first gate configured to receive an input sense signal, wherein the first transistor is configured to supply a first initial voltage to a first output node based on a first voltage of the first bit line when the input sense signal has a first logic level and to isolate the first output node from the first bit line when the input sense signal has a second logic level;
        a second transistor having a second source coupled to a second bit line and a second gate connected to the first gate and configured to receive the input sense signal, wherein the second transistor is configured to supply a second initial voltage to a second output node based on a second voltage of the second bit line when the input sense signal has the first logic level and to isolate the second output node from the second bit line when the input sense signal has the second logic level;
        a third transistor coupled to the second transistor and having a third gate directly coupled to the second bit line, the third transistor configured to discharge the first output node when the input sense signal has the second logic level;
        a fourth transistor coupled to the first transistor and having a fourth gate directly coupled to the first bit line, the fourth transistor configured to discharge the second output node when the input sense signal has the second logic level; and
        a fifth transistor having a fifth gate connected to the first gate and configured to receive the input sense signal, the fifth transistor coupled to the third transistor and to the fourth transistor.

2. The apparatus of claim 1, wherein the first transistor and the second transistor are p-type metal oxide semiconductor (PMOS) transistors.

3. The apparatus of claim 1, wherein the third transistor and the fourth transistor are n-type metal oxide semiconductor (NMOS) transistors.

4. The apparatus of claim 1, wherein an initial differential voltage corresponds to a difference between the first initial voltage and the second initial voltage, and wherein, when the input sense signal has the second logic level, the current latched sense amplifier is configured to:
    discharge the first output node responsive to a first value of the second bit line;
    discharge the second output node responsive to a second value of the first bit line; and amplify the initial differential voltage responsive to the discharge of the first output node or the discharge of the second output node.

5. The apparatus of claim 1, wherein the fifth transistor is configured to prevent a first current flow through the third transistor and a second current flow through the fourth transistor when the input sense signal has the first logic level, and wherein the fifth transistor is configured to permit the first current flow through the third transistor and the second current flow through the fourth transistor when the input sense signal has the second logic level.

6. The apparatus of claim 5, wherein the fifth transistor is configured to be activated based on the input sense signal, and wherein the fifth transistor is configured to provide a first path to ground for the first current flow through the third transistor and to provide a second path to ground for the second current flow through the fourth transistor.

7. The apparatus of claim 1, wherein the fifth transistor comprises an n-type metal oxide semiconductor (NMOS) transistor, and wherein the fifth transistor is coupled to ground.

8. The apparatus of claim 1, wherein the current latched sense amplifier further comprises:
a first capacitor coupled to the first output node, wherein the first capacitor is configured to discharge via a first discharge path through the third transistor, and wherein the first discharge path is non-conductive when the input sense signal has the first logic level; and
a second capacitor coupled to the second output node, wherein the second capacitor is configured to discharge via a second discharge path through the fourth transistor, and wherein the second discharge path is non-conductive when the input sense signal has the first logic level.

9. The apparatus of claim 8, wherein the first capacitor is configured to be charged based on the first voltage of the first bit line when the input sense signal has the first logic level.

10. The apparatus of claim 1, wherein the first logic level is a low logic level, and wherein the input sense signal has the first logic level during a first phase.

11. The apparatus of claim 1, wherein the second logic level is a high logic level, and wherein the input sense signal transitions from the first logic level to the second logic level in response to an activation of a second phase.

12. The apparatus of claim 1, wherein the current latched sense amplifier is integrated into an electronic device comprising a set top box, a music player, a video player, an entertainment unit, a navigation device, a mobile phone, a portable computer, a hand-held personal communication system (PCS) unit, a communications device, a personal digital assistant (PDA), a fixed location data unit, a computer, or a combination thereof.

13. The apparatus of claim 1, wherein the current latched sense amplifier is integrated into a memory array comprising a plurality of sense amplifiers.

14. The apparatus of claim 1, wherein the third transistor is configured to be activated based on the second voltage of the second bit line, and wherein the third gate of the third transistor is coupled to the second transistor.

15. The apparatus of claim 1, further comprising a first inverter and a second inverter, wherein the first inverter and the second inverter are cross-coupled, wherein the first inverter is coupled between a high-voltage bus associated with a supply voltage, and wherein the second inverter is coupled between the high-voltage bus and the fourth transistor.

16. The apparatus of claim 1, further comprising a sixth transistor and a seventh transistor, wherein the first output node is coupled between the sixth transistor and the seventh transistor.

17. The apparatus of claim 16, wherein the sixth transistor is coupled to a high voltage bus associated with a supply voltage, and wherein the seventh transistor is coupled between the first output node and the third transistor.

18. The apparatus of claim 16, wherein the sixth transistor is a p-type metal oxide semiconductor (PMOS) transistor, and wherein the seventh transistor is an n-type metal oxide semiconductor (NMOS) transistor.

19. The apparatus of claim 16, wherein a sixth gate of the sixth transistor and a seventh gate of the seventh transistor are coupled to the second transistor and to the second output node.

20. An apparatus for sensing a differential between two bit lines, comprising:
means for supplying a first initial voltage to a first output node of a sense amplifier based on a first voltage of a first bit line and for isolating the first bit line from the first output node, wherein the first initial voltage is supplied to the first output node when an input sense signal has a first logic level, and wherein the first bit line is isolated from the first output node when the input sense signal has a second logic level;
means for supplying a second initial voltage to a second output node of the sense amplifier based on a second voltage of a second bit line and for isolating the second bit line from the second output node connected to the means for supplying the first initial voltage to the first output node, wherein the second initial voltage is supplied to the second output node when the input sense signal has the first logic level, wherein the second bit line is isolated from the second output node when the input sense signal has the second logic level, and wherein the first voltage is independent of the second voltage;
first means for discharging the first output node, the first means for discharging coupled to the means for supplying the second initial voltage to the second output node, wherein the first means for discharging is activated based on the second voltage of the second bit line;
second means for discharging the second output node, the second means for discharging coupled to the means for supplying the first initial voltage to the first output node, wherein the second means for discharging is activated based on the first voltage of the first bit line; and
means for switching connected to the means for supplying the first initial voltage to the first output node, wherein the means for switching is configured to provide a discharge path based on the input sense signal, and wherein the means for switching is coupled to the first means for discharging and the second means for discharging.

21. The apparatus of claim 20, wherein a first discharge of the first output node and a second discharge of the second output node enable amplification of a differential voltage between the first output node and the second output node.

22. The apparatus of claim 20, wherein the first logic level is a low logic level, and wherein the input sense signal has the first logic level during a first phase.

23. The apparatus of claim 20, wherein the second logic level is a high logic level, and wherein the input sense signal transitions from the first logic level to the second logic level in response to an activation of a second phase.

24. The apparatus of claim 20, wherein the means for supplying the first initial voltage to the first output node and for isolating the first bit line from the first output node comprises a first p-type metal oxide semiconductor (PMOS) transistor.

25. The apparatus of claim 24, wherein the means for supplying the second initial voltage to the second output node and for isolating the second bit line from the second output node comprises a second PMOS transistor.

26. The apparatus of claim 20, wherein the first means for discharging comprises a first n-type metal oxide semiconductor (NMOS) transistor, and wherein the means for switching comprises a second NMOS transistor.

27. The apparatus of claim 26, wherein the second means for discharging comprises a third NMOS transistor.

28. The apparatus of claim 20, wherein the means for supplying the first initial voltage to the first output node and for isolating the first bit line from the first output node, the means for supplying the second initial voltage to the second output node and for isolating the second bit line from the second output node, the first means for discharging, the second means for discharging, and the means for switching are integrated into an electronic device, the electronic device comprising a set top box, a music player, a video player, an entertainment unit, a navigation device, a mobile phone, a portable computer, a hand-held personal communication system (PCS) unit, a communications device, a personal digital assistant (PDA), a fixed location data unit, a computer, or a combination thereof.

29. The apparatus of claim 20, wherein the means for supplying the first initial voltage to the first output node and for isolating the first bit line from the first output node, the means for supplying the second initial voltage to the second output node and for isolating the second bit line from the second output node, the first means for discharging, the second means for discharging, and the means for switching are integrated into a memory array.

30. The apparatus of claim 20, wherein the means for switching comprises an n-type metal oxide semiconductor (NMOS) transistor.

31. The apparatus of claim 20, wherein the means for switching is coupled to ground, and wherein the means for switching is coupled to the first means for discharging and the second means for discharging.

32. A method of amplifying current, the method comprising:
at a current latch sense amplifier comprising a first transistor having a first source coupled to a first bit line and a first gate coupled to receive an input sense signal, a second transistor having a second source coupled to a second bit line and a second gate connected to the first gate and coupled to receive the input sense signal, a third transistor coupled to the second transistor and having a third gate directly coupled to the second bit line, a fourth transistor coupled to the first transistor and having a fourth gate directly coupled to the first bit line, and a fifth transistor coupled to the third transistor and the fourth transistor and having a fifth gate connected to the first gate and coupled to receive the input sense signal, performing:
during a first phase:
coupling the first bit line to a first output node to supply a first initial voltage to the first output node, wherein the input sense signal has a first logic level during the first phase; and
coupling the second bit line to a second output node to supply a second initial voltage to the second output node, wherein an initial differential voltage corresponds to a difference between the first initial voltage and the second initial voltage; and
during a second phase:
decoupling the first bit line from the first output node, wherein the input sense signal has a second logic level during the second phase;
decoupling the second bit line from the second output node; and
amplifying the initial differential voltage by:
providing the first initial voltage to the fourth transistor;
providing the second initial voltage to the third transistor; and
discharging the first output node or the second output node.

33. The method of claim 32, further comprising, during the first phase, supplying the initial differential voltage to the current latch sense amplifier via the first bit line and the second bit line.

34. The method of claim 32, further comprising:
transferring, during the first phase, the initial differential voltage from the first bit line and the second bit line to the first output node and the second output node; and
preventing, during the second phase, transferring of the initial differential voltage from the first bit line and the second bit line to the first output node and the second output node.

* * * * *